(12) United States Patent
Michna et al.

(10) Patent No.: US 11,853,134 B2
(45) Date of Patent: Dec. 26, 2023

(54) FLUID COOLING ASSEMBLY FOR A COMPUTING SYSTEM

(71) Applicant: HEWLETT PACKARD ENTERPRISE DEVELOPMENT LP, Houston, TX (US)

(72) Inventors: Vincent W. Michna, Houston, TX (US); David S. Chialastri, Houston, TX (US); Nilashis Dey, Houston, TX (US); Yasir Jamal, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 141 days.

(21) Appl. No.: 17/498,925

(22) Filed: Oct. 12, 2021

(65) Prior Publication Data
US 2023/0114466 A1 Apr. 13, 2023

(51) Int. Cl.
G06F 1/20 (2006.01)
G06F 1/18 (2006.01)
H05K 7/20 (2006.01)

(52) U.S. Cl.
CPC .............. *G06F 1/20* (2013.01); *G06F 1/183* (2013.01); *H05K 7/20254* (2013.01); *G06F 2200/201* (2013.01); *H05K 7/20272* (2013.01)

(58) Field of Classification Search
CPC ...... G06F 1/20; G06F 1/183; G06F 2200/201; H05K 7/20254; H05K 7/20272; H05K 7/20772
See application file for complete search history.

(56) References Cited

U.S. PATENT DOCUMENTS

| | | | |
|---|---|---|---|
| 10,863,652 B1 | 12/2020 | Conroy et al. | |
| 11,212,943 B2* | 12/2021 | Heydari | H05K 7/1488 |
| 11,382,241 B2* | 7/2022 | Gao | H05K 7/20772 |
| 2014/0340847 A1* | 11/2014 | Iwakiri | H01L 23/40 |
| | | | 361/699 |
| 2015/0131224 A1* | 5/2015 | Barina | G06F 1/20 |
| | | | 361/679.53 |
| 2016/0128238 A1 | 5/2016 | Shedd et al. | |
| 2016/0183407 A1* | 6/2016 | Katsumata | H05K 1/181 |
| | | | 361/699 |
| 2022/0196507 A1* | 6/2022 | Subrahmanyam | G01M 3/20 |
| 2023/0009017 A1* | 1/2023 | Xiong | H05K 1/0203 |
| 2023/0084765 A1* | 3/2023 | Gao | H05K 7/20254 |
| | | | 361/679.53 |

* cited by examiner

*Primary Examiner* — Stephen S Sul
(74) *Attorney, Agent, or Firm* — Hewlett Packard Enterprise

(57) ABSTRACT

Example implementations relate to a fluid cooling assembly for a computing system, and a tool-less method of installing the fluid cooling assembly to the computing system. The fluid cooling assembly includes a plurality of cooling components, and a fluid chamber having a plurality of first fluid connectors. Further, each cooling component includes a plurality of second fluid connectors. Each first fluid connector or each second fluid connector includes a first end to protrude beyond a first surface of a circuit board of the computing system, and a second end to protrude beyond a second surface of the circuit board. Further, the first end of each first fluid connector is connected to the first end of a respective second fluid connector via the circuit board, to establish a parallel fluid flow path between the fluid chamber and each of the plurality of cooling components.

20 Claims, 8 Drawing Sheets

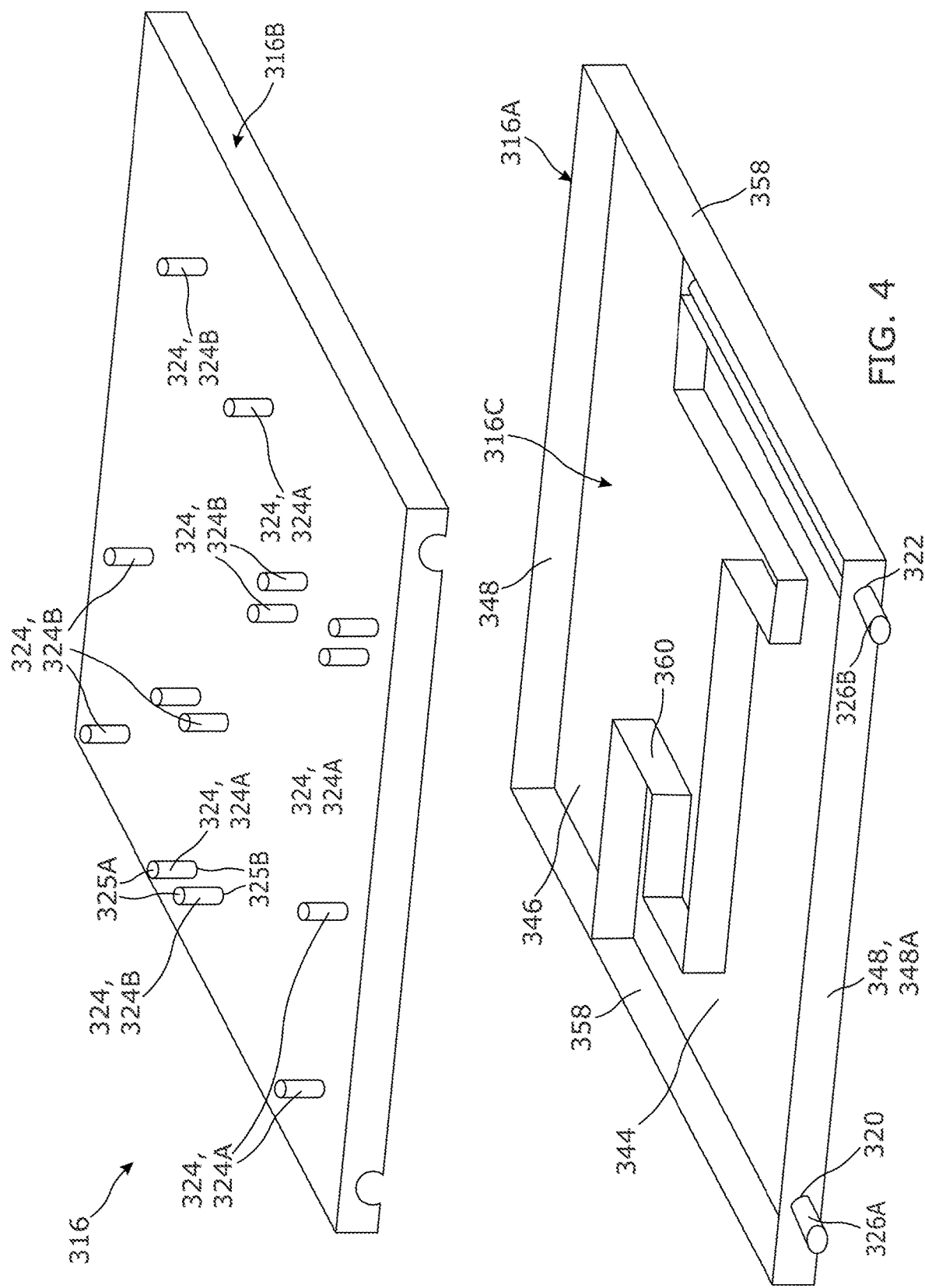

FLUID COOLING ASSEMBLY FOR A COMPUTING SYSTEM

BACKGROUND

A datacenter environment has computing systems, which while operating typically generate considerable amount of waste-heat. Air cooling systems are deployed in the datacenter environment to circulate air to the computing systems for cooling electronic components of the computing systems. However, certain computing systems in the datacenter environment have increased density (i.e., more components in a given amount of space) of electronic components for executing one or more complex workloads. Accordingly, the computing system generates excessive waste-heat. If adequate excessive waste-heat is not dissipated from such computing system, the waste-heat may exceed thermal specifications of the electronic components, thus resulting in degraded performance, reliability, and life expectancy of the electronic components, and in some cases equipment failure. Therefore, the datacenter environment may use fluid (e.g., liquid coolant) as a heat transfer medium instead of, or in addition to, air for cooling the computing systems or the electronic components of each computing system.

BRIEF DESCRIPTION OF THE DRAWINGS

Various examples will be described below with reference to the following figures.

FIG. 10 illustrates a block diagram of a portion of a circuit board and a fluid cooling assembly of the computing system of FIGS. 1A-1B, according to an example implementation of the present disclosure.

FIG. 4 illustrates an exploded view of another fluid chamber of a fluid cooling assembly according to another example implementation of the present disclosure.

DETAILED DESCRIPTION

Figure 1A:
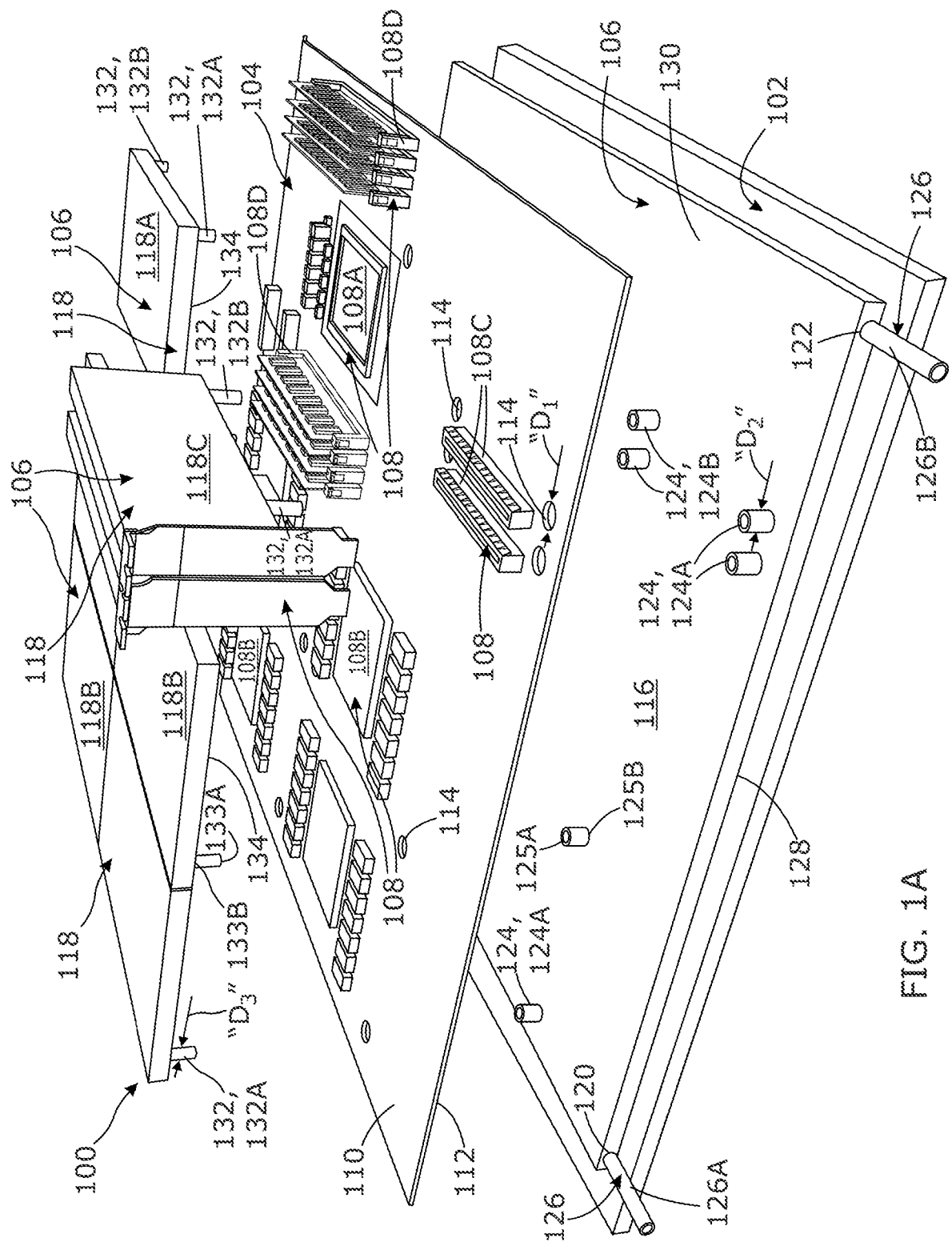
FIG. 1A illustrates an exploded perspective view of a computing system according to an example implementation of the present disclosure.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing example embodiments only and is not intended to be limiting. As used herein, the singular forms "a," "an," and "the" are intended to include the plural forms as well, unless the context clearly indicates otherwise. The term "plurality," as used herein, is defined as two, or more than two. The term "another," as used herein, is defined as at least a second or more. The term "coupled," as used herein, is defined as connected, whether directly without any intervening elements or indirectly with at least one intervening element, unless otherwise indicated. Two elements may be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

As used herein, the term "fluid connector" may refer to a type of a mechanical coupler, which connects (couples) to another mechanical coupler to fluidically connect at least two chambers to each other. As used herein the term "tool-less" design may refer to a type of design incorporated in fluid connectors that enables the fluid connectors to be connected (or disconnected) to each other without the need for any tools, to complete assembly (or disassembly) of a fluid cooling component. As used herein the term "cold component" may refer to a type of a thermal conductive component, which contains an internal channel or microchannel through which a cooled fluid is directed to absorb a waste-heat transferred to the cooling component by a waste-heat producing component, for example, a circuit board of the computing system or a plurality of electronic components mounted on the circuit board. For example, the cold component may also be referred to as a cold plate or a liquid-cooled dissipater. The term "fluid" may refer to a liquid medium or a gaseous medium of the coolant. Further, the term "plugging-in" may refer to connecting the fluid connectors (e.g., fluid plugs or fluid receptacles) to each other by way of pushing or inserting one of the fluid plug or the fluid receptacle into other of the fluid plug or the fluid receptacle. Similarly, the term "plugging-out" may refer to disconnecting the fluid connectors from each other by way of pulling or extracting one of the fluid plug or the fluid receptacle from the other one of the fluid plug or the fluid receptacle. Further, as used herein, the term "thermal interface" may refer to surfaces of two components, which are directly in contact with each other or indirectly in contact with each other through a thermal interface material (TIM) to promote the transfer of the waste-heat from one component to the other component. It may be noted herein: an object, device, or assembly (which may include multiple distinct bodies that are thermally coupled, and may include multiple different materials), is "thermally conductive" between two thermal interfaces if any one of the following is true: (i) a heat transfer coefficient between the thermal interfaces is between 40 $W \cdot m^{-2} \cdot K^{-1}$ to 100 $W \cdot m^{-2} \cdot K^{-1}$ at any temperature between 0° C. and 100° C., (ii) the object includes a material that has a thermal conductivity (often denoted k, λ, or κ) between the two interfaces between 40 $W \cdot m^{-2} \cdot K^{-1}$ to 100 $W \cdot m^{-2} \cdot K^{-1}$ at any temperature between 0° C. and 100° C., or (iii) the object is a heat pipe, vapor chamber, body of copper, or body of aluminum. Examples of materials whose thermal conductivity is between 40 $W \cdot m^{-2} \cdot K^{-1}$ to 100 $W \cdot m^{-2} \cdot K^{-1}$ at any temperature between 0° C. and 100° C. include certain types of copper, aluminum, silver, and gold, for example.

Figure 5:
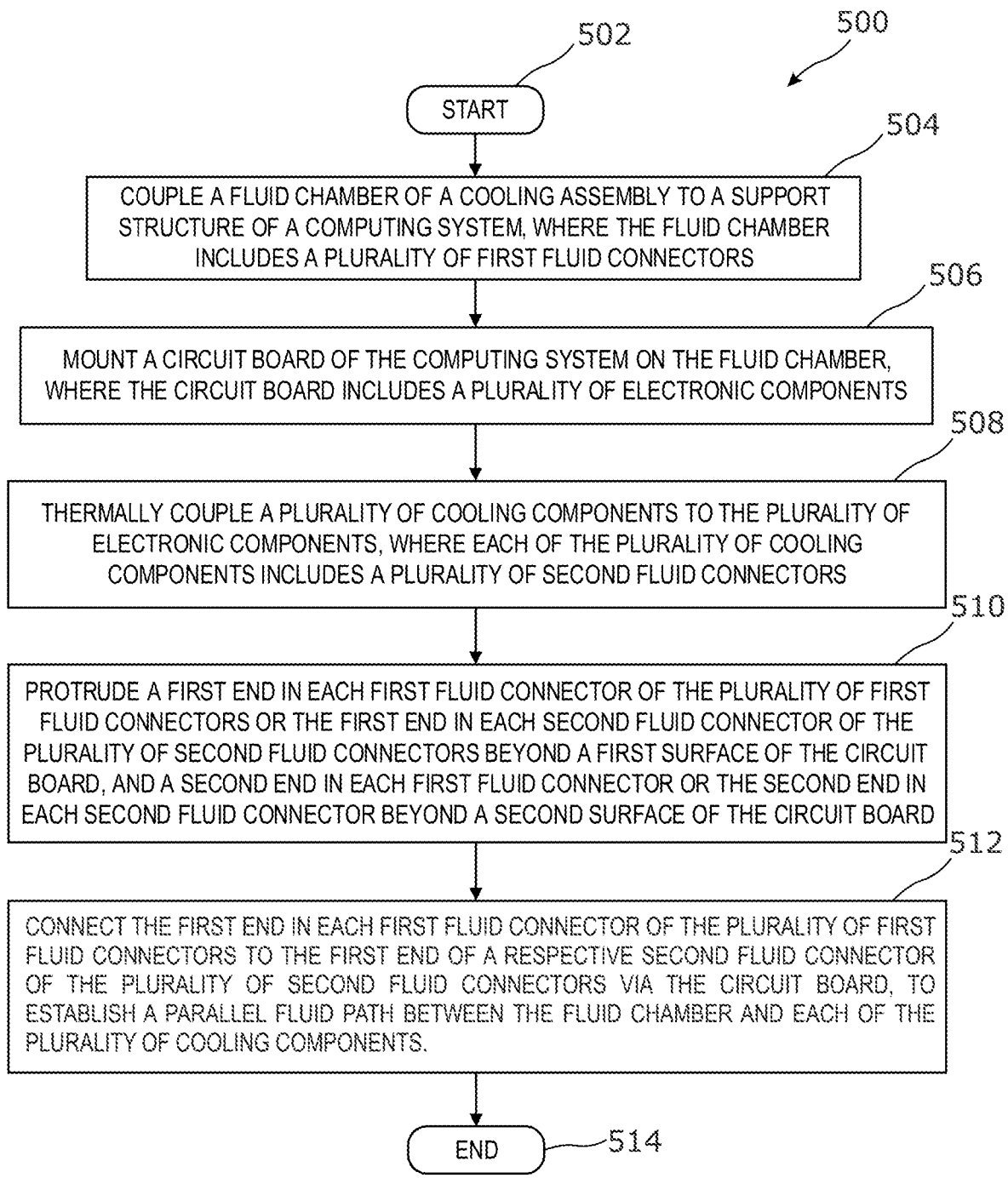
FIG. 5 illustrates a flowchart depicting a method of assembling a fluid cooling assembly according to an example implementation of the present disclosure.

For purposes of explanation, certain examples are described with reference to the components illustrated in FIGS. 1-5. The functionality of the illustrated components may overlap, however, and may be present in a fewer or greater number of elements and components. Further, all or part of the functionality of illustrated elements may co-exist or be distributed among several geographically dispersed locations. Moreover, the disclosed examples may be implemented in various environments and are not limited to the illustrated examples. Further, the sequence of operations described in connection with FIG. 5 is an example and is not intended to be limiting. Additional or fewer operations or combinations of operations may be used or may vary without departing from the scope of the disclosed examples. Thus, the present disclosure merely sets forth possible examples of implementations, and many variations and modifications may be made to the described examples. Such modifications and variations are intended to be included within the scope of this disclosure and protected by the following claims.

A datacenter environment has computing systems for executing one or more workloads. Typically, each computing system has a circuit board with one or more electronic components, such as processors or electronic connectors mounted thereon. The electronic components generate considerable amount of waste-heat, while operating to execute the one or more workloads. The waste-heat may have to be dissipated from each computing system to enable proper functioning of the electronic components, and prevent damage to the circuit board and the electronic components from the waste-heat.

Various mechanisms have been developed to dissipate the waste-heat from each computing system in the datacenter environment. For instance, one mechanism is an ambient air cooling mechanism, where the ambient air is directed to flow over the electronic components and the circuit board of each computing system to dissipate the waste-heat. However, the ambient air cooling mechanism has a relatively low effectiveness because of its inability to maintain continuous flow of the ambient air over the electronic components and the circuit board. Hence, another mechanism, such as a forced air cooling mechanism is used to enhance the effectiveness of waste-heat dissipation from each computing system. In the forced air cooling mechanism, fans are operated to blow the air continuously along an air flow path formed between the electronic components, and over the electronic components and the circuit board to dissipate the waste-heat. However, certain computing systems have densely packed electronic components for executing one or more complex workloads. Therefore, it may be difficult to form the air flow path between the electronic components in a computing system that has densely packed electronic components. Hence, the forced air cooling mechanism may also be insufficient to dissipate the waste-heat from the computing system that has densely packed electronic components.

Therefore, yet another mechanism, such as a fluid-flow cooling mechanism is used to dissipate the waste-heat from a computing system having such densely packed electronic components. A fluid-flow cooling mechanism, e.g., a series fluid-flow mechanism, uses a cooled liquid for dissipating the waste-heat from the computing system. For example, in the series fluid-flow mechanism, one flowline extends through multiple cooling components (e.g., one or more upstream and one or more downstream cooling components) that are arranged in a series configuration, where each cooling component is in thermal contact with a respective electronic component. The flowline directs the cooled liquid-coolant from the one or more upstream cooling components to the one or more downstream cooling components. Each cooling component among the one or more upstream and downstream cooling components dissipates the waste-heat from the respective electronic component to the cooled liquid and generates a heated liquid. However, the series fluid-flow mechanism is insufficient to uniformly dissipate the waste-heat from each electronic component because the one or more upstream cooling components receives the cooled liquid to dissipate the waste-heat, whereas the one or more downstream cooling components receives the heated liquid to dissipate the waste-heat. This may cause the one or more downstream cooling components to be insufficient to dissipate the waste-heat from the respective electronic components. To address such issues in the series fluid-flow mechanism, a parallel fluid-flow mechanism is envisioned. A parallel fluid-flow mechanism may have multiple flowlines extending into and out of the computing system where each flowline passes through a respective cooling component that is in thermal contact with a respective electronic component. In other words, a separate flowline may pass through each cooling component. As a result, the parallel fluid-flow mechanism enables each flowline to supply the cooled liquid-coolant to the respective cooling component in order to uniformly dissipate the waste-heat from all electronic components. Implementing the parallel fluid-flow mechanism requires a substantial modification of the computing system. For example, the computing system may require substantial plumbing modifications in order to include: i) multiple flowlines extending into and out of the chassis of the computing system, and ii) fluid inlet and fluid outlet connectors for connecting each cooling component to the respective flowline. Further, technicians may need to implement complicated processes to complete the connection of each cooling component to the respective flowline. Also, during a service or installation event, the technicians may require appropriate specialized tools for connecting (or disconnecting) each cooling component to its respective flowline. Additionally, each of the multiple flowlines, the fluid inlet and fluid outlet connectors, and each of the multiple cooling components may have to be removed from the computing system during a service event, which makes servicing more time consuming and cumbersome.

A technical solution to the aforementioned problems include providing a fluid cooling assembly having a fluid chamber and a plurality of cooling components fluidically connected to the fluid chamber. For example, each of the plurality of cooling components is fluidically connected to the fluid chamber via a circuit board, and thermally connected to a respective electronic component of a plurality of electronic components mounted to the circuit board. In some examples, the fluid chamber is coupled to a support structure of a computing system, and a circuit board having the plurality of electronic components is mounted on the fluid chamber. Further, each cooling component is disposed on a surface of the circuit board and fluidically connected to the fluid chamber through the circuit board. In other words, the circuit board is sandwiched between the fluid chamber and the plurality of cooling components of the fluid cooling assembly.

The fluid chamber further includes a plurality of first connectors, and each cooling component includes a plurality of second connectors. The circuit board may include a plurality of through-holes. In some examples, the plurality of first connectors protrudes beyond a first surface (or top surface) of the circuit board via the plurality of through-holes, and fluidically connect to the plurality of second connectors to establish a parallel fluid flow path between the fluid chamber and each cooling component. In some other examples, the plurality of second connectors protrudes beyond a second surface (or bottom surface) of the circuit board via the plurality of through-holes, and fluidically connect to the plurality of first connectors to establish the parallel fluid flow path between the fluid chamber and each cooling component.

The fluid chamber further includes a fluid inlet and a fluid outlet. The plurality of first connectors of the fluid chamber, includes a plurality of first inlet connectors and a plurality of first outlet connectors. Similarly, the plurality of second connectors of each cooling component, includes a second inlet connector and a second outlet connector. In such examples, a portion of the fluid chamber receives a cooled fluid (e.g., cooled liquid-coolant) from a coolant source via the fluid inlet. Later, the cooled liquid-coolant flows from the portion of the fluid chamber to each cooling component via at least one first inlet connector of the fluid chamber and the second inlet connector of the respective cooling component. In such examples, each cooling component transfers a waste-heat absorbed from the respective electronic component to the cooled liquid-coolant, and generates a heated fluid (e.g., heated liquid-coolant). Further, the heated liquid-coolant flows from each cooling component to another portion of the fluid chamber via the second outlet connector of the respective cooling component and at least one first outlet connector of the fluid chamber. Later, the fluid chamber directs the heated liquid-coolant from the other portion of the fluid chamber to a coolant regeneration device via the fluid outlet.

In some examples, the portion of the fluid chamber is an inlet conduit, and the other portion of the fluid chamber is an outlet conduit, where each of the inlet and outlet conduits are disposed within the fluid chamber. In some other examples, the portion of the fluid chamber is a first fluid section, and the other portion of the fluid chamber is a second fluid section, where each of the first and second fluid sections are discrete sections that are formed within the fluid chamber.

Since the fluid chamber of the fluid cooling assembly has only one fluid inlet and outlet that need to be connected to a respective flowline drawn into and out of the computing system, there is no requirement for making plumbing modifications to the computing system for installing the fluid cooling assembly in the computing system. Further, since the plurality of first fluid connectors are pre-connected to the fluid chamber, and the plurality of second fluid connectors are pre-connected to the respective cooling component, the technicians may not need to perform additional tasks to connect the fluid connectors to the respective components.

Some examples incorporate a tool-less design for connecting and disconnecting each cooling component to the fluid chamber to complete the fluid cooling assembly. For example, each fluid connector of the fluid chamber may be one of a quick-disconnect plug or a quick-disconnect receptacle, and each fluid connector of the cooling component is the other one of the quick-disconnect plug or the quick-disconnect receptacle. Therefore, such fluid connectors of the fluid chamber and the respective cooling components, may be easily connected and disconnected to each other without the need of any tools. Further, during a service or installation event, the technicians may not require specialized tools for connecting and disconnecting the fluid connectors of the fluid chamber and the respective cooling component to each other. Additionally, since each of the plurality of cooling components may be independently connectable to and detachable from the fluid chamber, the whole fluid cooling assembly may not need to be removed from the computing system during service event. Further, since the fluid cooling assembly requires only two flowlines to connect to the fluid inlet and outlet and interconnecting the fluid connectors may be accomplished without tools, the fluid cooling assembly process may be simplified.

Accordingly, the present disclosure describes example implementations of a fluid cooling assembly for a computing system, and a tool-less method of installing the fluid cooling assembly to the computing system. The fluid cooling assembly includes a fluid chamber and a plurality of cooling components. The fluid chamber includes a plurality of first fluid connectors and each cooling component includes a plurality of second fluid connectors. Each first fluid connector of the plurality of first fluid connectors, or each second fluid connector of the plurality of second fluid connectors includes a first end to protrude beyond a first surface of a circuit board of the computing system, and a second end to protrude beyond a second surface of the circuit board. Further, the first end of each first fluid connector is connected to the first end of a respective second fluid connector through the circuit board, to establish a parallel fluid flow path between the fluid chamber and each of the plurality of cooling components.

Figure 1B:
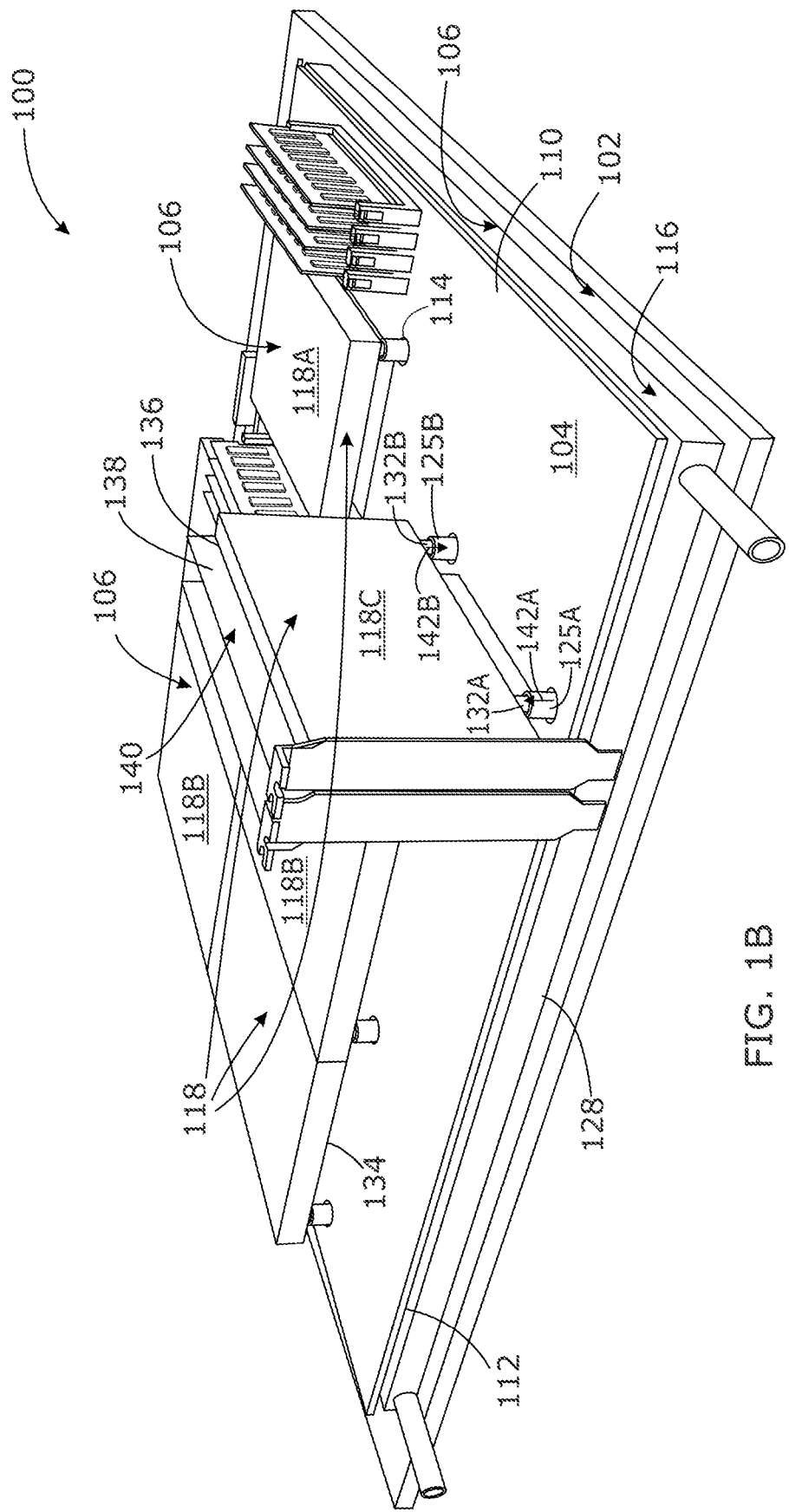
FIG. 1B illustrates an assembled perspective view of the computing system of FIG. 1A, according to an example implementation of the present disclosure.
Figure 1C:
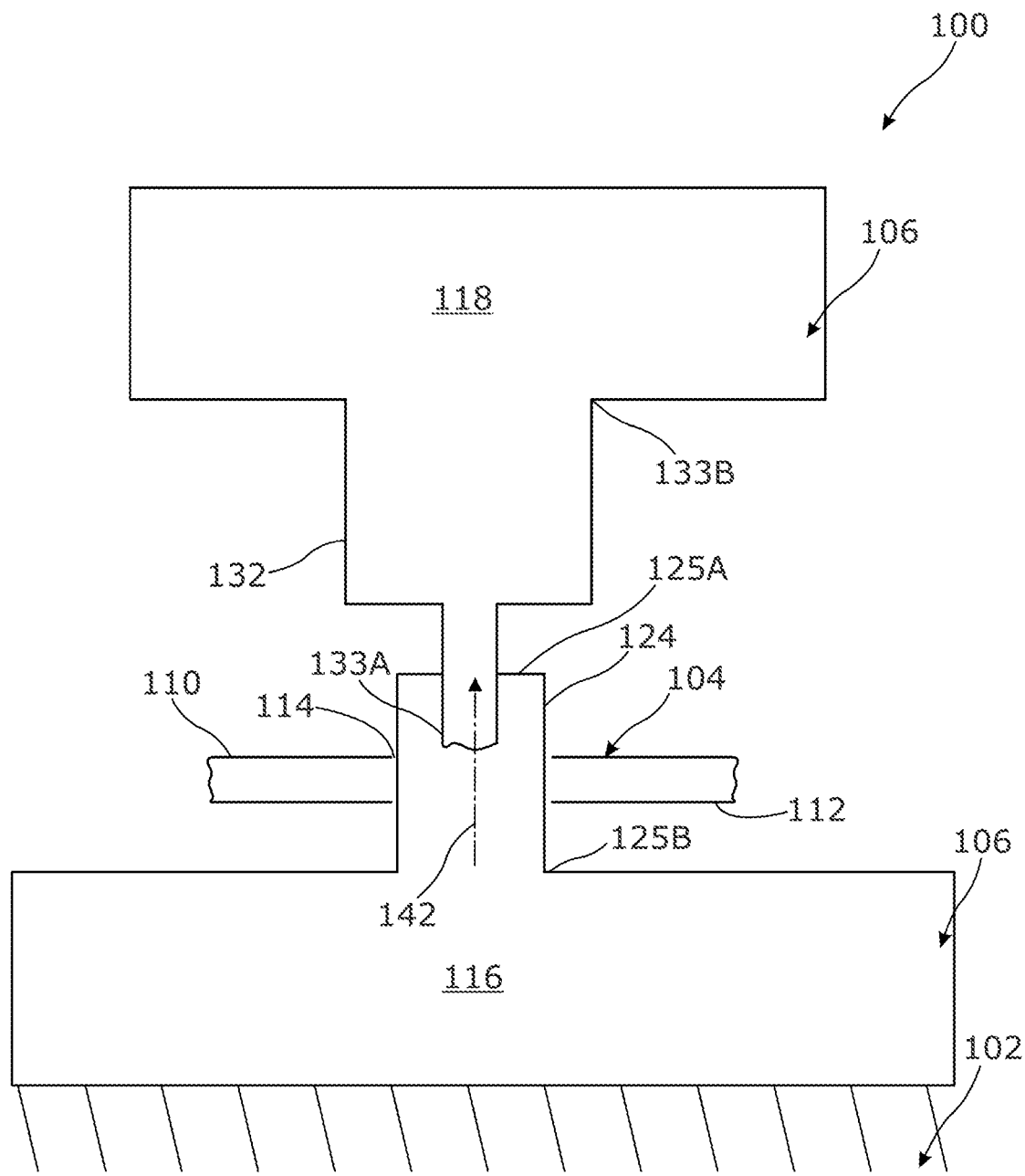

Turning to the Figures, FIG. 1A depicts an exploded perspective view of a computing system 100. FIG. 1B depicts an assembled perspective view of the computing system 100 of FIG. 1A. FIG. 10 depicts a block diagram of a portion of a circuit board 104 and a fluid cooling assembly 106 of the computing system 100 of FIGS. 1A-1B. In the description hereinafter, the Figures, FIGS. 1A-1C are described concurrently for ease of illustration.

In some examples, the computing system 100 is a server system, such as a blade server system, a rack server system, or the like. In some other examples, the computing system 100 may be a storage system, a power conversion system, a networking system, a communication system, an access point, or the like without deviating from the scope of the present disclosure. In some examples, the computing system 100 includes a support structure 102, the circuit board 104 having a plurality of electronic components 108 mounted thereon, and the fluid cooling assembly 106. In one or more examples, the fluid cooling assembly 106 and the circuit board 104 are housed within the support structure 102. Further, the computing system 100 having the support structure 102, the circuit board 104, and the fluid cooling assembly 106, may be deployed in an enclosure or a rack of a datacenter environment (not shown). In one or more examples, the computing system 100 may be deployed in the datacenter environment, due to a high computing ability of the plurality of electronic components 108 and/or the circuit board 104 to execute one or more complex workloads. In one or more examples, the plurality of electronic components 108 and/or the circuit board 104, while functioning to execute the one or more complex workloads, may generate an excessive amount of waste-heat. Accordingly, the computing system 100 includes a cooling mechanism, e.g., the fluid cooling assembly 106 to dissipate adequate amount of the excessive waste heat from the computing system 100 so as to enable proper functioning of the plurality of electronic components 108 and/or the circuit board, and prevent possible damage to the plurality of electronic components 108 and/or the circuit board 104 from the excessive waste-heat. As discussed hereinabove, the computing system 100 includes the support structure 102, the circuit board 104, and the fluid cooling assembly 106.

In some examples, the support structure 102 is a sheet metal component, which may be coupled to one or more struts (not shown) of the computing system 100. In some other examples, the support structure 102 may be a chassis or a housing without deviating from the scope of the present disclosure. The support structure 102 may include one or more inner clamping members (not shown) to allow fastening of the fluid cooling assembly 106 to the support structure 102. Further, the support structure 102 may include one or more outer clamping members (not shown) to allow fastening of the support structure 102 to the enclosure or the rack of the datacenter environment.

In some examples, the circuit board 104 is a printed circuit board (PCB) having the plurality of electronic components 108 mounted thereon. For example, the plurality of electronic components 108 is affixed at designated locations on a first surface 110 (e.g., a top surface) of the circuit board 104 by means of soldering. The circuit board 104 further includes electrical and/or signal traces formed on a second surface 112 (e.g., a bottom surface) of the circuit board 104. In some examples, the traces extend between lead ends (not shown) of each of the plurality of electronic components 108 and a corresponding terminal port (not shown) of the circuit board 104. In the example of FIGS. 1A-1C, the first surface 110 and the second surface 112 are mutually opposite surfaces. In one or more examples, the term "first surface" and "second surface" of the circuit board 104 may be used interchangeably without deviating from the scope of the present disclosure. The circuit board 104 further has a plurality of through-holes 114, which are spaced apart from each other and formed at designated locations on the circuit board 104. Each through-hole of the plurality of through-holes 114 extends between the first surface 110 and the second surface 112 of the circuit board 104. It may be noted herein that each through-hole of the plurality of through-holes 114 may be located proximate to a respective electronic component of the plurality of electronic components 108. Further, each through-hole of the plurality of through-holes 114 has a first diameter "$D_1$".

In some examples, the plurality of electronic components 108 includes a central processing unit (CPU) 108A, a plurality of graphical processing units (GPUs) 108B, a plurality of peripheral component interconnect express (PCIe) connectors 108C, and a plurality of dual in-line memory modules (DIMMs) connectors 108D, which are mounted on the circuit board 104. In the example of FIGS. 1A-1B, the circuit board 104 includes one CPU 108A, four GPUs 108B, two PCIe connectors 108C, and eight DIMMs connectors 108D.

In one or more examples, the fluid cooling assembly 106 is an open loop parallel cooling system for dissipating a waste-heat from the plurality of electronic components 108 and/or the circuit board 104 of the computing system 100. For example, the fluid cooling assembly 106 is configured to receive a cooled fluid (not shown) from a fluid source (not shown). The fluid cooling assembly 106 is further configured to dissipate a waste-heat from the computing system 100 by directing the received cooled fluid to establish a thermal contact with the plurality of electronic components 108 and/or the circuit board 104, and generate a heated fluid (not shown). Further, the fluid cooling assembly 106 is configured to discharge the heated fluid to a fluid regeneration device (not shown). In some examples, the fluid cooling assembly 106 includes an internal fluid segregation mechanism to isolate the cooled fluid from the heated fluid. In some examples, the cooled fluid is a cooled liquid-coolant, such as a cooled water, and the heated fluid is a heated liquid-coolant. In some other examples, the cooled fluid is a cooled gas-coolant, such as a helium, a hydrogen, or the like without deviating from the scope of the present disclosure. In some examples, the fluid cooling assembly 106 includes the fluid chamber 116 and a plurality of cooling components 118, where each cooling component 118 is fluidically coupled to fluid chamber 116 to define the open loop parallel cooling system.

In one or more examples, the fluid chamber 116 functions as a fluid tank. In such examples, the fluid chamber 116: i) receives the cooled liquid-coolant from the fluid source, ii) directs the cooled liquid-coolant to each of the plurality of cooling components 118, iii) receives the heated liquid-coolant from each of the plurality of cooling components 118, and iv) discharges the heated liquid-coolant to the fluid regeneration device. In one or more examples, the fluid chamber 116 includes the fluid segregation mechanism to isolate the cooled liquid-coolant from the heated liquid-coolant. The fluid segregation mechanism is discussed in greater details in the example of FIGS. 3A-3B and FIG. 4.

In some examples, the computing system 100 may not include a separate support structure 102, as shown and discussed hereinabove in FIGS. 1A-1B. In such examples, the fluid chamber 116 may additionally function as the support structure of the computing system 100.

In some other examples, the support structure 102 and the fluid chamber 116 may be integrated to each other to form a unitary support fluid chamber. In such examples, a portion of the support structure 102 may additionally include an enclosure, which may function as the fluid chamber 116. For example, the enclosure may be located on the portion of an upper surface of the support structure 102. In one or more examples, the unitary support fluid chamber may be made of sheet metal.

In the example of FIGS. 1A-1C, the fluid chamber 116 is a sheet metal enclosure. For example, the fluid chamber 116 includes a base portion 116A and a cover portion 116B (as clearly shown in FIGS. 3A, 3B) mounted on and coupled to the base portion 116A to define a hollow space 116C therebetween. The fluid chamber 116 may include one or more clamping members (not shown) disposed on an upper surface 130 of the fluid chamber 116, to allow fastening of the circuit board 104 to the fluid chamber 116. The fluid chamber 116 includes a fluid inlet 120, a fluid outlet 122, an inlet conduit 144 (as shown in FIG. 3A), an outlet conduit 146 (as shown in FIG. 3A), and a plurality of first fluid connectors 124.

The fluid inlet 120 and the fluid outlet 122 are spaced apart from each other and formed on a peripheral wall of the base portion 116A. Each of the fluid inlet 120 and the fluid outlet 122 are connected to one flowline of a pair of flowlines 126 extending into and out of the computing system 100. For example, the fluid inlet 120 is connected to the fluid source via an inlet flowline 126A for receiving the cooled liquid-coolant from the fluid source. Further, the fluid outlet 122 is connected to the fluid regeneration device via an outlet flowline 126B for directing the heated liquid-coolant from the fluid chamber 116. In some examples, the pair of flowlines 126 is made of a flexible material, such as a polymer material or the like.

Each first fluid connector of the plurality of first fluid connectors 124 protrudes outwards from the upper surface 130 of the fluid chamber 116. In one or more examples, each first fluid connector 124 has a first end 125A and a second end 125B located opposite to the first end 125A. In some examples, the first end 125A is located outside the upper surface 130 of the fluid chamber 116, and the second end 125B is located inside the hollow space 116C. In one or more examples, the plurality of first fluid connectors 124 includes a plurality of first inlet connectors 124A and a plurality of first outlet connectors 124B. In such examples, the first inlet connector 124A and the first outlet connector 124B protrude outward from the upper surface 130 of the fluid chamber 116. In one or more examples, each of the plurality of first inlet connector 124A directs the cooled liquid-coolant from the fluid chamber 116 to a respective cooling component of the plurality of cooling components 118. Similarly, each of the plurality of first outlet connector 124B directs the heated liquid-coolant from the respective cooling component 118 to the fluid chamber 116. In one or more examples, each first fluid connector 124 has a second diameter "$D_2$". In some examples, the second diameter "$D_2$" is substantially smaller than the first diameter "$D_1$" of each through-hole 114 formed on the circuit board 104.

Figure 3A:
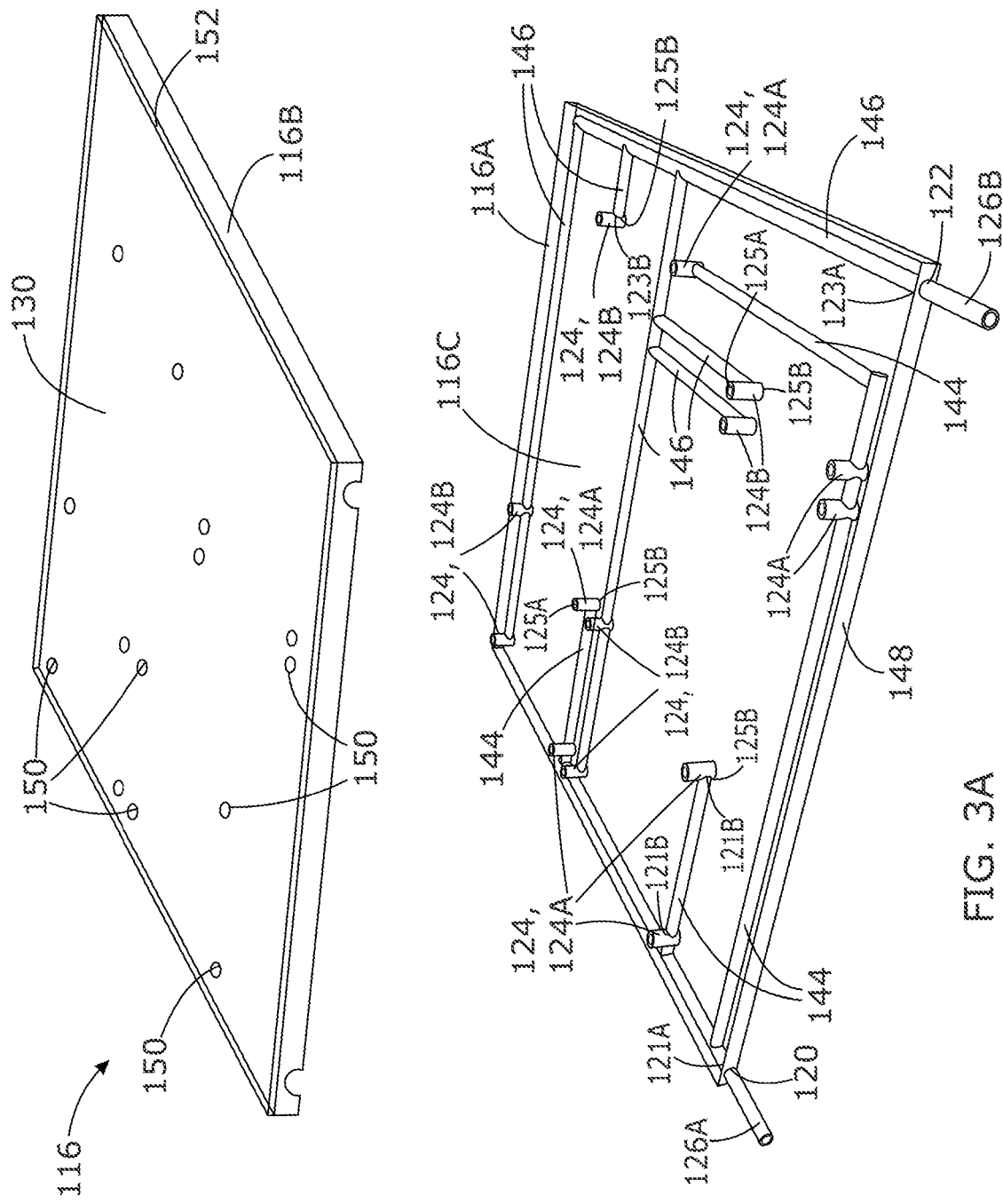
FIG. 3A illustrates an exploded view of a fluid chamber of a fluid cooling assembly of the computing system of FIGS. 1A-1B, according to an example implementation of the present disclosure.

In some examples, the inlet conduit 144 and the outlet conduit 146 (as shown in FIG. 3A) may be collectively referred to as the fluid segregation mechanism, which may be used to isolate the cooled liquid-coolant from the heated liquid-coolant. In one or more examples, the inlet conduit 144 and the outlet conduit 146 are disposed within the hollow space 116C of the fluid chamber 116. Further, the inlet conduit 144 is connected to the fluid inlet 120 and the second end 125B of each of the plurality of first inlet connectors 124A. In addition, the outlet conduit 146 is connected to the fluid outlet 122 and the second end 125B of each of the plurality of first outlet connectors 124B. Thus, the inlet conduit 144 and the outlet conduit 146 may isolate the cooled liquid-coolant from the heated liquid-coolant.

In one or more examples, the cooling component 118 is a waste-heat dissipater of the fluid cooling assembly 106. Each cooling component 118: i) receives the cooled liquid-coolant from the fluid chamber 116, ii) absorbs the waste-heat from a respective electronic component of the plurality of electronic components 108 and/or the circuit board 104, iii) transfers the absorbed waste-heat to the cooled liquid-coolant, and generates the heated liquid-coolant, and iv) directs the heated liquid-coolant to the fluid chamber 116.

In some examples, each of the plurality of cooling components 118 is a thermally conductive component, for example, a cold plate. In such examples, each of the plurality of cooling components 118 has internal channels or micro channels (not shown) for circulating the cooled liquid-coolant, absorbing the waste-heat, and generating the heated liquid-coolant. Each of the plurality of cooling components 118 includes a plurality of second fluid connectors 132. In one or more examples, the plurality of second fluid connectors 132 are formed on a lower surface 134 of each cooling component of the plurality of cooling components 118. In one or more examples, each second fluid connector 132 has a first end 133A and a second end 133B located opposite to the first end 133A. In some examples, the first end 133A is located outside the lower surface 134 of each cooling component 118, and the second end 133B is located on the lower surface 134 of each cooling component 118, and fluidically coupled to internal channels or the micro channels of each cooling component 118. In one or more examples, each second fluid connector 132 has a third diameter "$D_3$". In some examples, the third diameter "$D_3$" is smaller than the first diameter "$D_1$". In some examples, the second diameter "$D_2$" of each first fluid connector 124 is greater than the third diameter "$D_3$" of each second fluid connector 132. In some other examples, the third diameter "$D_3$" of each second fluid connector 132 is greater than the second diameter "$D_2$" of each first fluid connector 124.

The plurality of second fluid connectors 132 includes a second inlet connector 132A and a second outlet connector 132B. In such examples, the second inlet connector 132A and the second outlet connector 132B protrude outward from the lower surface 134 of each cooling component 118. In one or more examples, the second inlet connector 132A directs the cooled liquid-coolant from the fluid chamber 116 to the internal channel of the respective cooling component 118. Similarly, the second outlet connector 132B directs the heated liquid-coolant from the internal channel of the respective cooling component 118 to the fluid chamber 116.

In some examples, the plurality of cooling components 118 includes a CPU cooling component 118A, a plurality of GPU cooling components 118B, and a plurality of PCIe cooling components 118C. In the example of FIGS. 1A-1B, the fluid cooling assembly 106 includes one CPU cooling component 118A, four GPU cooling components 118B, and two PCIe cooling components 118C.

In one or more examples, each of the plurality of first fluid connectors 124 is one of a quick-disconnect plug or a quick-disconnect receptacle. Similarly, each of the plurality of second fluid connectors 132 is the other one of the quick-disconnect plug or the quick-disconnect receptacle. For example, in FIGS. 1A-1C, each of the plurality of first fluid connectors 124 is a quick-disconnect receptacle, and each of the plurality of second fluid connectors 132 is a quick-disconnect plug. In such examples, each quick-disconnect plug may be plugged-in to the corresponding quick-disconnect receptacle to establish a fluid flow path between the fluid chamber 116 and the respective cooling component 118. Similarly, each quick-disconnect plug may be plugged-out of the corresponding quick-disconnect receptacle to disestablish the fluid flow path between the fluid chamber 116 and the respective cooling component 118. In one or more examples, the quick-disconnect receptacle and the quick-disconnect plug may be connected to each other to establish a liquid-tight (e.g., a leak-free) fluid connection between the fluid chamber 116 and each cooling component 118.

The quick-disconnect receptacle and the quick-disconnect plug may be connected to each other by way of plugging-in one of the quick-disconnect receptacle or the quick-disconnect plug into the other one of the quick-disconnect receptacle or the quick-disconnect plug without the usage of any tools. Similarly, the quick-disconnect receptacle and the quick-disconnect plug may be disconnected from each other by plugging-out one of the quick-disconnect receptacle of the quick-disconnect plug from the other one of the quick-disconnect receptacle or the quick-disconnect plug without the usage of any tools.

In one or more examples, each of the quick-disconnect plug and the quick-disconnect receptacle may include an internal valve. In such examples, the internal valve of each of the quick-disconnect plug and the quick-disconnect receptacle may open-up when the plug and the receptacle are connected to each other in order to establish the parallel fluid flow path therebetween. Similarly, the internal valve of each of the quick-disconnect plug and the quick-disconnect receptacle may close-down, when the plug and the receptacle are disconnected from each other in order to disestablish the parallel fluid flow path therebetween, and also prevent leakage of the fluid from the respective component, for example, the fluid chamber 116 and the respective cooling component 118. In some other examples, each fluid connector of the plurality of first and second fluid connectors 124, 132 respectively, may include a separate draining device to withdraw the fluid, when the first and second fluid connectors 124, 132 respectively, are disconnected so as to prevent leakage of the fluid from the respective component.

Referring to FIGS. 1B-1C, during the assembly process, the fluid chamber 116 is first mounted on and coupled to the support structure 102. For example, the lower surface 128 of the fluid chamber 116 may be mounted on and coupled to the support structure 102 such that the one or more inner clamping members of the support structure 102 is fastened to the fluid chamber 116 so as to secure the fluid chamber 116 to the support structure 102. Further, the circuit board 104 is mounted on and coupled to the fluid chamber 116. For example, the second surface 112 of the circuit board 104 may be mounted on and coupled to the fluid chamber 116 such that one or more clamping members of the fluid chamber 116 is fastened to the circuit board 104 so as to secure the circuit board 104 to the fluid chamber 116.

Referring to FIG. 1D, upon mounting the circuit board 104 on the fluid chamber 116, the first end 125A in each first fluid connector of the plurality of first fluid connectors 124 protrudes beyond the first surface 110 of the circuit board 104. Whereas, the second end 125B (as shown in FIG. 1A) in each first fluid connector of the plurality of first fluid connectors 124 protrudes beyond the second surface 112 of the circuit board 104. In the example of FIGS. 1B-1C, the first end 125A of each first fluid connector 124 passes through a respective through-hole of the plurality of through-holes 114 in order to protrude beyond the first surface 110 of the circuit board 104.

Referring back to FIG. 1B, each of the plurality of cooling components 118 is independently mounted on a portion of the circuit board 104, such that a thermal interface (or a thermal contact) is established between each cooling component 118 and a respective electronic component 108. In such examples, upon mounting each of the plurality of cooling components 118 on the portion of the circuit board 104, the first and second ends 133A, 133B of each second fluid connector 132 are located above (or protrude above) the first surface 110 of the circuit board 104. In one or more examples, the portion of the circuit board 104 is sandwiched between each cooling component 118 and the fluid chamber 116, upon mounting each cooling component 118 on the circuit board 104.

In some examples, the lower surface 134 of the CPU cooling component 118A and the plurality of GPU cooling components 118B are mounted on the portion of the circuit board 104 such that the thermal interface is established between the CPU cooling component 118A and the CPU 108A, and between the plurality of GPU cooling components 118B and the plurality of GPUs 108B. In some other examples, a peripheral surface 136 of the PCIe cooling component 118C is attached/coupled to a PCIe card 138 such that the thermal interface is established between the PCIe cooling component 118C and the PCIe card 138, and a cooling assembly 140 of the PCIe cooling component 118C and the PCIe card 138 is formed. In such examples, the cooling assembly 140 may be mounted on the portion of the circuit board 104, and connected to one of the plurality of PCIe connectors 108C. In certain examples, a thermal interface material (not shown) may be disposed between each cooling component 118 and the respective electronic component 108 to indirectly establish the thermal interface between those components.

Referring back to FIG. 1D, when the plurality of cooling components 118 (or the cooling assembly 140) is mounted on the portion of the circuit board 104, the first end 133A of each second fluid connector 132 is connected to the first end 125A of the respective first fluid connector 124. Accordingly, a fluid flow path 142 is established between the fluid chamber 116 and the respective cooling component 118, upon forming the connection between each second fluid connector 132 and the respective first fluid connector 124. In one or more examples, an inlet fluid flow path 142A and an outlet fluid flow path 142B (as shown in FIG. 1A) are established between the fluid chamber 116 and each cooling component of the plurality of cooling components 118.

In some examples, establishing the thermal interface between each cooling component 118 and the respective electronic component 108, and connecting the second fluid connector 132 of each cooling component 118 to the corresponding first fluid connector 124 of the fluid chamber 116, are performed simultaneously. In such examples, each cooling component 118 (or the cooling assembly 140) is independently pushed vertically downwards to establish the thermal interface with the respective electronic component 108, and to connect each second fluid connector 132 of the corresponding cooling component 118 to the respective first fluid connector 124. Similarly, in some examples, each of the plurality of cooling components 118 (or the cooling assembly 140) is independently pulled vertically upwards to disestablish the thermal interface from the respective electronic component 108, and to disconnect each second fluid connector 132 of the corresponding cooling component 118 from the respective first fluid connector 124.

In some other examples, the fluid chamber 116 may be disposed outside the support structure 102. In such examples, the upper surface 130 of the fluid chamber 116 may be coupled to the support structure 102. Further, the support structure 102 may include a plurality of through-holes, each vertically aligned with a respective fluid connector of the plurality of first fluid connectors 124. Accordingly, in such examples, when the fluid chamber 116 is coupled to the support structure 102, each fluid connector of the plurality of first fluid connectors 124 may protrude via the plurality of through-holes in the support structure 102 and the plurality of through-holes 114 in the circuit board 104. Further, when each cooling component 118 is mounted on the circuit board 104, each fluid connector of the plurality of second fluid connectors 132 is connected to the respective fluid connector of the plurality of first fluid connectors 124. In one or more examples, positioning the fluid chamber 116 outside the support structure 102 may enable an easy way of retrofitting the fluid cooling assembly 106 to the existing support structure 102, and also performing service of the fluid cooling assembly 106. In some examples, the fluid chamber 116 may be made of polymer material.

Referring back to FIGS. 1A-1C, during operation, the circuit board 104 and the plurality of electronic components 108 executes the one or more complex workloads, and thereby results in generating an excessive amount of the waste heat. In such examples, the fluid cooling assembly 106 dissipates an adequate amount of the excessive waste-heat from the computing system 100 so as to enable proper functioning of each of the plurality of electronic components 108 and/or the circuit board to continue execution of the one or more complex workloads. Accordingly, in some examples, the inlet conduit 144 of the fluid chamber 116 receives the cooled liquid-coolant from the fluid source via the inlet flowline 126A and the fluid inlet 120. Further, the inlet conduit 144 of the fluid chamber 116 directs the received cooled liquid-coolant (potentially in a parallel or semi-parallel liquid flow) to each cooling component 118 via the inlet fluid flow path 142A established between the first inlet connector 124A of the fluid chamber 116 and the second inlet connector 132A of each cooling component 118. In such examples, each cooling component 118 dissipates the waste-heat from the respective electronic component 108 to the cooled liquid-coolant and generates a heated liquid-coolant. For example, each cooling component 118 absorbs the waste-heat from the respective electronic component 108 and directs the cooled liquid-coolant received from the fluid chamber 116 via the internal channel (or microchannel) so as to allow the transfer of the waste heat from each cooling component 118 to the cooled liquid-coolant, and generate the heated liquid-coolant. Each cooling component 118 further directs the heated liquid-coolant (potentially in a parallel or semi-parallel liquid flow) to the outlet conduit 146 of the fluid chamber 116 via the outlet fluid flow path 142B established between the second outlet connector 132B of each cooling component 118 and the first outlet connector 124B of the fluid chamber 116. Further, the outlet conduit 146 of the fluid chamber 116 directs the heated liquid-coolant to the fluid regeneration device via the fluid outlet 122 and the outlet flowline 126B.

Figure 2:
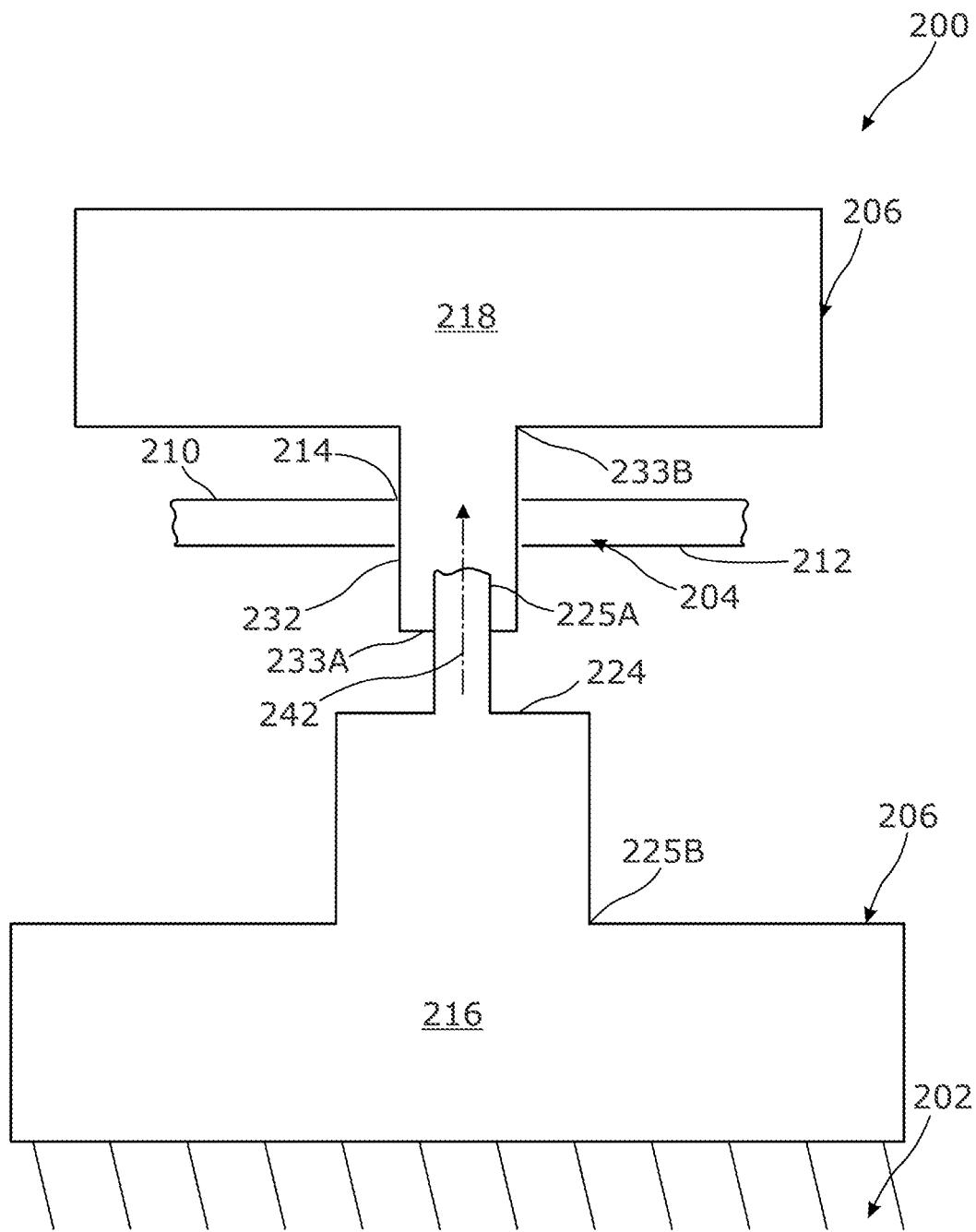
FIG. 2 illustrates a block diagram of a portion of a circuit board and another fluid cooling assembly of a computing system according to another example implementation of the present disclosure.

FIG. 2 depicts a block diagram of a portion of a circuit board 204 and another fluid cooling assembly 206 of a computing system 200. The circuit board 204 is similar to a circuit board 104 discussed hereinabove in the example of FIGS. 1A-1C. The fluid cooling assembly 206 is substantially similar to a fluid cooling assembly 106, as discussed hereinabove in the example of FIGS. 1A-1C, except for a first fluid connector 224 of a fluid chamber 216, a second fluid connector 232 of the cooling component 208, and a method of connecting the first fluid connector 224 and the second fluid connector 232 to each other.

In some examples, the computing system 200 includes a support structure 202, the circuit board 204, and the fluid cooling assembly 206. The circuit board 204 has a through-hole 214 extending between a first surface 210 and a second surface 212 of the circuit board 204. In one or more examples, the term "first surface" and "second surface" of the circuit board may be used interchangeably without deviating from the scope of the present disclosure. The fluid cooling assembly 206 includes the fluid chamber 216 and the cooling component 208. In such examples, the fluid chamber 216 includes the first fluid connector 224 having a first end 225A and a second end 225B. Similarly, the cooling component 218 includes the second fluid connector 232 having a first end 233A and a second end 233B. In some examples, the first fluid connector 224 is a quick-disconnect plug and the second fluid connector 232 is a quick-disconnect receptacle.

In one or more examples, the fluid chamber 216 is mounted on and coupled to the support structure 202. The circuit board 204 is mounted on and coupled to the fluid chamber 216 such that the first and second ends 225A, 225B respectively of the first fluid connector 224, are located below (or protruded below) the second surface 212 of the circuit board 204. Further, the cooling component 218 is mounted on the circuit board 204 such that a thermal interface is established between the cooling component 218 and an electronic component (not shown) affixed/coupled to the circuit board 204. In such examples, upon mounting the cooling component 218 on the circuit board 204, the first end 233A of the second fluid connector 233 protrudes beyond the second surface 212 of the circuit board 204. In addition, the second end 233B of the second fluid connector 233 protrudes beyond the first surface 210 of the circuit board 204. In one or more examples, when the cooling component 218 is mounted on the portion of the circuit board 204, the first end 233A of the second fluid connector 232, is simultaneously connected to the first end 225A of the first fluid connector 224. Accordingly, a parallel fluid flow path 242 is established between the fluid chamber 216 and the cooling component 218, upon forming the connecting between the second fluid connector 232 and the first fluid connector 224.

Figure 3B:
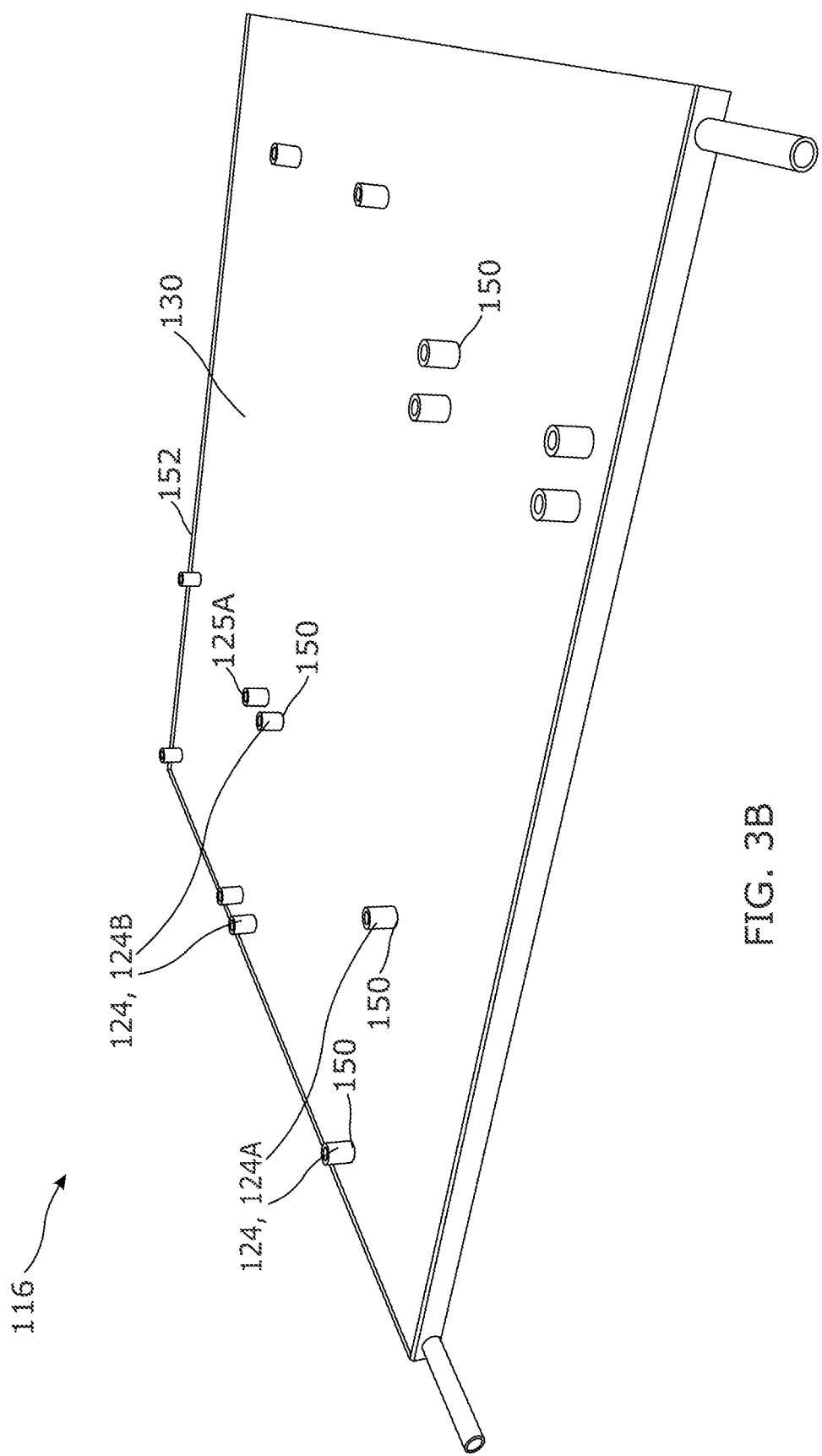
FIG. 3B illustrates an assembled view of the fluid chamber of the fluid cooling assembly of FIG. 3A, according to an example implementation of the present disclosure.

In some other examples, the fluid chamber 216 may be disposed outside the support structure 202. In such examples, the upper surface of the fluid chamber 216 may be coupled to the support structure 202. Further, the support structure 202 may include a plurality of through-holes, each vertically aligned with a respective fluid connector of the plurality of second fluid connectors 232. Accordingly, in such examples, when the fluid chamber 216 is coupled to the support structure 202, each fluid connector of the plurality of first fluid connectors 224 may position outside the support structure 202. In addition, when each cooling component 218 is mounted on the circuit board 204, each fluid connector of the plurality of second fluid connectors 232 may protrude via the plurality of through-holes 214 in the circuit board 204 and the plurality of through-holes in the support structure 202, and connect to the respective fluid connector of the plurality of first fluid connectors 224. In one or more examples, positioning the fluid chamber 216 outside the support structure 202 may enable an easy way of retrofitting the fluid cooling assembly 206 to the existing support structure 202, and also performing service of the fluid cooling assembly 206. In some examples, the fluid chamber 216 may be made of polymer material FIG. 3A depicts an exploded view of a fluid chamber 116 of a fluid cooling assembly 106 of the computing system 100 of FIGS. 1A-1B. FIG. 3B depicts an assembled view of the fluid chamber 116 of the fluid cooling assembly 106 of FIG. 3A. In the description hereinafter, the Figures, FIGS. 3A and 3B are described concurrently for ease of illustration. As discussed hereinabove, the fluid chamber 116 may be a sheet metal enclosure. For example, the fluid chamber 116 includes a base portion 116A and a cover portion 116B.

Referring to FIG. 3A, the base portion 116A may be a box-shaped component having a hollow space 116C therein. In one or more examples, the base portion 116A includes a fluid inlet 120, a fluid outlet 122, a plurality of first fluid connectors 124, an inlet conduit 144, and an outlet conduit 146. In some examples, the fluid inlet 120 and the fluid outlet 122 are spaced apart from each other and formed on a peripheral wall 148 of the base portion 116A. Each first fluid connector 124 has a first end 125A and a second end 125B located opposite to the first end 125A. Further, the plurality of first fluid connectors 124 includes a plurality of first inlet connectors 124A and a plurality of first outlet connectors 124B. The inlet conduit 144 and the outlet conduit 146 are disposed within the hollow space 116C of the base portion 116A. In some examples, each of the inlet conduit 144 and the outlet conduit 146 is a piped network. For example, the inlet conduit 144 has one end portion 121A coupled to the fluid inlet 120, and multiple connector portions 121B, where each connector portion 121B is connected to the second end 125B of a respective first inlet connector of the plurality of first inlet connectors 124A. Similarly, the outlet conduit 146 has one end portion 123A coupled to the fluid outlet 122, and multiple connector portions 123B, where each connector portion 123B is connected to the second end 125B of a respective first outlet connector of the plurality of first outlet connectors 124B. As discussed hereinabove, the inlet conduit 144 and the outlet conduit 146 may be collectively referred to as the fluid segregation mechanism, which may be used to isolate the cooled liquid-coolant from the heated liquid-coolant in the fluid chamber 116.

The cover portion 116B may be a lid-shaped component. In one or more examples, the cover portion 116B includes a plurality of holes 150 spaced apart from each other, and formed on the upper surface 130 of the cover portion 116B. In one or more examples, the plurality of holes 150 is vertically aligned with the plurality of first fluid connectors 124. In some examples, the upper surface 130 further includes a dielectric layer 152. In some examples, the dielectric layer 152 may be used to electrically insulate the fluid chamber 116 from the circuit board 104.

Referring to FIG. 3B, the cover portion 116B is mounted on and coupled to the base portion 116A to form the fluid chamber 116. In one or more examples, upon mounting the cover portion 116B on the base portion 116A, the plurality of first fluid connectors protrude beyond the upper surface 130 of the cover portion 116B via the plurality of through-holes 114. For example, the first end 125A of each of the plurality of first fluid connectors 124 is disposed outside the cover portion 116B, and the second end 125B of each of the plurality of first fluid connectors 124 is disposed in the hollow space 116C of the base portion 116A. Thus, a portion of each first fluid connector 124 is disposed within the fluid chamber 116 of the base portion 116A and another portion of each first fluid connector 124 is disposed outside the fluid chamber 116.

As discussed hereinabove with reference to FIGS. 1B-1C, each of the plurality of first inlet connectors 124A may be connected to a respective second inlet connector 132A of each cooling component 118 to establish an inlet fluid flow path 142A between the fluid chamber 116 and each cooling component 118. Similarly, each of the plurality of first outlet connectors 124B may be connected to a respective second outlet connector 132B of each cooling component 118 to establish an outlet fluid flow path 142B between each cooling component 118 and the fluid chamber 116.

Accordingly, during operation of the fluid cooling assembly 106, the inlet conduit 144 of the fluid chamber 116, may receive the cooled liquid-coolant from the fluid source via the inlet flowline 126A, the fluid inlet 120, and the end portion 121A. The inlet conduit 144 may direct a flow of the cooled liquid-coolant to each cooling component 118 via the inlet fluid flow path 142A. Each cooling component 118 may direct the cooled liquid-coolant via the internal channel to dissipate the waste-heat and generate the heated liquid-coolant. Further, each cooling component 118 may direct the heated liquid-coolant to the outlet conduit 146 via the outlet fluid flow path 142B. The outlet conduit 146 may further discharge the heated liquid-coolant to the fluid regeneration device via the end portion 123A, the fluid outlet 122, and the outlet flowline 126B.

FIG. 4 depicts an exploded view of another fluid chamber 316 of a fluid cooling assembly. In some examples, the fluid cooling assembly may further include a plurality of cooling components, as discussed in the examples of FIGS. 1A-1C. The fluid chamber 316 may be a sheet metal enclosure. For example, the fluid chamber 316 includes a base portion 316A and a cover portion 316B.

The base portion 316A may be a box-shaped component having a hollow space 316C therein. In one or more examples, the base portion 316A includes a fluid inlet 320, a fluid outlet 322, a first fluid section 344, and a second fluid section 346. In some examples, the fluid inlet 320 and the fluid outlet 322 are spaced apart from each other and formed on a peripheral wall 348A of a pair of first peripheral walls 348 of the base portion 316A. The first fluid section 344 and the second fluid section 346 are formed within the hollow space 316C of the base portion 316A. For example, the base portion 316A includes a circuitous wall 360 connected to a pair of second peripheral walls 358 of the base portion 316A, thereby separating the hollow space 316C into the first fluid section 344 and the second fluid section 346. In such examples, the first fluid section 344 is connected to the fluid inlet 320 and the second fluid section 346 is connected to the fluid outlet 322. As discussed hereinabove, the first fluid section 344 and the second fluid section 346 may be collectively referred to as the fluid segregation mechanism, which may be used to isolate a cooled liquid-coolant from a heated liquid-coolant in the fluid chamber 316.

The cover portion 316B may be a lid-shaped component. In one or more examples, the cover portion 316B includes a plurality of first fluid connectors 324 spaced apart from each other, and formed on an upper surface 330 of the cover portion 316B. Each first fluid connector 324 has a first end 325A and a second end 325B located opposite to the first end 325A. In some examples, the second end 325B is mounted on the upper surface 330 of the cover portion 316B and connected to the hollow space 316C of the fluid chamber 316. The first end 325A protrudes outward from the upper surface 330 of the cover portion. The plurality of first fluid connectors 324 includes a plurality of first inlet connectors 324A and a plurality of first outlet connectors 324B. In one or more examples, the plurality of first inlet connectors 324A are vertically aligned with the first fluid section 344 of the base portion 316A, and the plurality of first outlet connectors 324B are vertically aligned with the second fluid section 346 of the base portion 316A.

In one or more examples, the cover portion 316B may be mounted on and coupled to the base portion 316A to form the fluid chamber 316 of the fluid cooling assembly. In one or more examples, upon mounting the cover portion 316B on the base portion 316A, the second end 325B of each of the plurality of first inlet connectors 324A is fluidically connected to the first fluid section 344 of the fluid chamber 316 to establish an inlet fluid flow path between the first fluid section 344 of the fluid chamber 316 and each cooling component. Similarly, the second end 325B of each of the plurality of first outlet connectors 324B is fluidically connected to the second fluid section 346 of the fluid chamber 316 to establish an outlet fluid flow path between each cooling component and the second fluid section 346 of the fluid chamber 316.

Accordingly, during operation of the fluid cooling assembly, the first fluid section 344 of the fluid chamber 316, may receive the cooled liquid-coolant from a fluid source via an inlet flowline 326A and the fluid inlet 320. The first fluid section 344 may direct a flow of the cooled liquid-coolant to each cooling component via the inlet fluid flow path. Each cooling component may direct the cooled liquid-coolant via an internal channel to dissipate the waste-heat, and generate the heated liquid-coolant. Further, each cooling component may direct the heated liquid-coolant to the second fluid section 346 via the outlet fluid flow path. The second fluid section 346 may further discharge the heated liquid-coolant to a fluid regeneration device via the fluid outlet 322, and the outlet flowline 326B.

FIG. 5 is a flow diagram a flowchart depicting a method 500 of assembling a fluid cooling assembly to a computing system. It should be noted herein that the method 500 is described in conjunction with FIGS. 1A-1C and FIG. 3A-3B, for example.

The method 500 starts at block 502 and continues to block 504. At block 504, the method 500 includes coupling a fluid chamber of the fluid cooling assembly to a support structure of the computing system. In some examples, the support structure may include one or more inner clamping members to allow fastening of the fluid chamber to the support structure. In one or more examples, the fluid chamber includes a plurality of first fluid connectors including a plurality of first inlet connectors and a plurality of first outlet connectors. The fluid chamber further includes a fluid segregation mechanism to isolate a cooled liquid-coolant from a heated liquid-coolant within the fluid chamber. In some examples, the fluid segregation mechanism includes an inlet conduit and an outlet conduit disposed within the fluid chamber. In such examples, the inlet conduit is configured to receive the cooled liquid-coolant from a fluid source, and direct the cooled liquid-coolant to downstream components, such as cooling components. The outlet conduit is configured to receive the heated liquid-coolant from the downstream components and discharge the heated liquid-coolant to a fluid regeneration device. In some other examples, the fluid segregation mechanism includes a first fluid section and a second fluid section formed within the fluid chamber. In such examples, the first fluid section is configured to receive the cooled liquid-coolant from the fluid source, temporarily store the cooled liquid-coolant, and direct the cooled liquid-coolant to the downstream components. The second fluid section is configured to receive the heated liquid-coolant from the downstream components, temporarily store the heated liquid-coolant, and direct the heated liquid-coolant from the fluid chamber to the fluid regeneration source. The method 500 continues to block 506.

At block 506, the method 500 includes mounting a circuit board of the computing system on the fluid chamber. In some examples, one or more clamping members of the fluid chamber is fastened to the circuit board so as to secure the circuit board to the fluid chamber. In one or more examples, the circuit board includes a plurality of electronic components mounted thereon. Further, the circuit board includes a plurality of through-holes, each vertically aligned to the plurality of first fluid connectors of the fluid chamber. The method 500 continues to block 508.

At block 508, the method 500 includes thermally coupling each cooling component of the plurality of cooling components to a respective electronic component of the plurality of electronic components. In some examples, each cooling component may be independently mounted on a portion of the circuit board such that a thermal interface is established between each cooling component and the respective electronic component. In one or more examples, each cooling component includes a plurality of second fluid connectors including a second inlet connector and a second outlet connector. The method 500 continues to block 510.

At block 510, the method 500 includes protruding a first end of each first fluid connector of the plurality of first fluid connectors or the first end of each second fluid connector of the plurality of second fluid connectors beyond a first surface of the circuit board, and a second end of each first fluid connector or the second end of each second fluid connector beyond the second surface of the circuit board. In one or more examples, the term "first surface" and "second surface" of the circuit board may be used interchangeably without deviating from the scope of the present disclosure.

In some examples, the first end of each of the plurality of first fluid connectors is protruded beyond the first surface of the circuit board by passing through a respective through-hole of the circuit board. For example, upon mounting the circuit board on the fluid chamber, the first end of the plurality of first fluid connectors is protruded beyond the first surface of the circuit board, and the second end of the plurality of first fluid connectors is protruded beyond the second surface of the circuit board.

In some other examples, the first end of each of the plurality of second fluid connectors is protruded beyond the second surface of the circuit board by passing through the respective through-hole of the circuit board. For example, upon mounting the cooling component on the circuit board, the first end of each of the plurality of second fluid connectors protrudes beyond the second surface of the circuit board, and the second end of each of the plurality of second fluid connectors protrudes beyond the first surface of the circuit board. The method 500 continues to block 512.

At block 512, the method 500 includes connecting the first end of each first fluid connector to the first end of a respective second fluid connector via the circuit board, to establish a parallel fluid flow path between the fluid chamber and each cooling component. In some examples, each of the first fluid connectors may be one of a quick-disconnect plug or a quick-disconnect receptacle, and each of the second fluid connector may be the other one of the quick-disconnect plug or the quick-disconnect receptacle. Thus, the first and second fluid connectors may be connected to each other without the need of any tools.

In one or more examples, the steps of establishing the thermal interface between each cooling component and the respective electronic component, and connecting the first and second fluid connectors to each other, may be performed simultaneously. The method 500 ends at block 514.

Various features as illustrated in the examples described herein may be implemented as a tool-less method of quickly and easily assembling/disassembling a fluid cooling assembly by a technician or a customer, thus reducing the down time of the computing system and efforts associated to such events of assembling and disassembling the fluid cooling assembly. Further, the fluid cooling assembly may be provided as a "one stop liquid cooling solution kit" to customers to easily install and/or quickly replace an air cooling assembly of the computing system with the one stop liquid cooling solution kit. Since the fluid chamber of the fluid cooling assembly, has one fluid inlet and one fluid outlet that need to be connected to a respective flowline drawn into and out of the computing system, there is no requirement for making plumbing modifications to the computing system for installing the fluid cooling assembly in the computing system. Further, since the fluid chamber has a plurality of first fluid connectors that is pre-connected to the fluid chamber, and each cooling component has a plurality of second fluid connectors that is pre-connected to the respective cooling component, technicians may not need to perform additional tasks to connect the fluid connectors to the respective components.

In the foregoing description, numerous details are set forth to provide an understanding of the subject matter disclosed herein. However, implementation may be practiced without some or all of these details. Other implementations may include modifications, combinations, and varia- It is intended that the following claims cover such modifications and variations.

What is claimed is:

1. A fluid cooling assembly for a computing system, comprising:
    a fluid chamber comprising a plurality of first fluid connectors; and
    a plurality of cooling components, each cooling component comprising a plurality of second fluid connectors,
    wherein each first fluid connector of the plurality of first fluid connectors and each second fluid connector of the plurality of second fluid connectors comprises a first end and a second end, wherein the first end of each first fluid connector of the plurality of first fluid connectors or of each second fluid connector of the plurality of second fluid connectors protrudes beyond a first surface of a circuit board of the computing system, and the second end of each first fluid connector of the plurality of first fluid connectors or of each second fluid connector of the plurality of second fluid connectors protrudes beyond a second surface of the circuit board, and wherein the first end of each first fluid connector of the plurality of first fluid connectors is connected to the first end of a respective second fluid connector of the plurality of second fluid connectors via the circuit board, to establish a parallel fluid flow path between the fluid chamber and each of the plurality of cooling components.

2. The fluid cooling assembly of claim 1, wherein the plurality of first fluid connectors comprises a plurality of first inlet connectors and a plurality of first outlet connectors, wherein each first inlet connector and each first outlet connector protrude outwards from an upper surface of the fluid chamber, wherein the plurality of second fluid connectors comprises a second inlet connector and a second outlet connector, and wherein the second inlet connector and the second outlet connector protrude outwards from a lower surface of a respective cooling component of the plurality of cooling components.

3. The fluid cooling assembly of claim 2, wherein at least one first inlet connector of the plurality of first inlet connectors and the second inlet connector are connected to each other to allow a flow of a cooled fluid from the fluid chamber to the respective cooling component, and wherein at least one first outlet connector of the plurality of first outlet connectors and the second outlet connector are connected to each other to allow a flow of a heated fluid from the respective cooling component to the fluid chamber.

4. The fluid cooling assembly of claim 3, wherein each cooling component is thermally coupled to an electronic component of the computing system, and wherein the respective cooling component transfers a waste-heat absorbed from a respective electronic component to the cooled fluid, and generates the heated fluid.

5. The fluid cooling assembly of claim 2, wherein the fluid chamber comprises a fluid inlet, a fluid outlet, a first fluid section, and a second fluid section, wherein the first fluid section and the second fluid section are disposed within the fluid chamber, wherein the first fluid section is connected to the fluid inlet and to the second end of each of the plurality of first inlet connectors, and wherein the second fluid section is connected to the second end of each of the plurality of first outlet connectors and to the fluid outlet.

6. The fluid cooling assembly of claim 2, wherein the fluid chamber comprises a fluid inlet, a fluid outlet, an inlet conduit, and an outlet conduit, wherein the inlet conduit and the outlet conduit are disposed within the fluid chamber, and wherein the inlet conduit is connected to the fluid inlet and to the second end of each of the plurality of first inlet connectors, and wherein the outlet conduit is connected to the second end of each of the first outlet connectors and to the fluid outlet.

7. The fluid cooling assembly of claim 2, wherein the upper surface of the fluid chamber comprises a dielectric layer.

8. The fluid cooling assembly of claim 1, wherein each of the plurality of cooling components is pushed vertically downwards to connect each second fluid connector of the plurality of second fluid connectors to a respective first fluid connector of the plurality of first fluid connectors, and wherein each of the plurality of cooling components is pulled vertically upwards to disconnect each second fluid connector of the plurality of second fluid connectors from the respective first fluid connector of the plurality of first fluid connectors.

9. The fluid cooling assembly of claim 1, wherein each first fluid connector of the plurality of first fluid connectors is one of a quick-disconnect plug or a quick-disconnect receptacle, and wherein each second fluid connector of the plurality of second fluid connectors is the other of the quick-disconnect plug or the quick-disconnect receptacle.

10. A computing system comprising:
    a support structure;
    a circuit board comprising a plurality of electronic components; and
    a fluid cooling assembly comprising:
        a fluid chamber coupled to the support structure, wherein the fluid chamber comprises a plurality of first fluid connectors; and
        a plurality of cooling components thermally coupled to the plurality of electronic components, wherein each cooling component comprises a plurality of second fluid connectors,
        wherein at least a portion of the circuit board is sandwiched between the fluid chamber and the plurality of cooling components, wherein each first fluid connector of the plurality of first fluid connectors and each second fluid connector of the plurality of second fluid connectors comprises a first end and a second end, wherein the first end of each first fluid connector of the plurality of first fluid connectors or of each second fluid connector of the plurality of second fluid connectors protrudes beyond a first surface of the circuit board, and the second end of each first fluid connector of the plurality of first fluid connectors or of each second fluid connector of the plurality of second fluid connectors protrudes beyond a second surface of the circuit board, and wherein the first end of each first fluid connector of the plurality of first fluid connectors is connected to the first end of a respective second fluid connector of the plurality of second fluid connectors via the circuit board, to establish a parallel fluid flow path between the fluid chamber and each of the plurality of cooling components.

11. The computing system of claim 10, wherein the circuit board has a plurality of through-holes spaced apart from each other and extending between the first and second surfaces, wherein the first end of each first fluid connector of the plurality of first fluid connectors or the first end of each second fluid connector of the plurality of second fluid connectors passes through a respective through-hole of the plurality of through-holes to protrude beyond the first surface of the circuit board, and wherein the fluid chamber and each cooling component are fluidically connected to each other via respective first and second fluid connectors.

12. The computing system of claim 10, wherein the plurality of first fluid connectors comprises a plurality of first inlet connectors and a plurality of first outlet connectors, wherein each first inlet connector and each first outlet connector protrude outwards from an upper surface of the fluid chamber, wherein the plurality of second fluid connectors comprises a second inlet connector and a second outlet connector, and wherein the second inlet connector and the second outlet connector protrude outwards from a lower surface of a respective cooling component of the plurality of cooling components.

13. The computing system of claim 12, wherein at least one first inlet connector of the plurality of first inlet connectors and the second inlet connector are connected to each other to allow a flow of a cooled fluid from the fluid chamber to the respective cooling component, wherein the respective cooling component transfers a waste-heat absorbed from a respective electronic component to the cooled fluid, and generates a heated fluid, and wherein at least one first outlet connector of the plurality of first outlet connectors and the second outlet connector are connected to each other to allow a flow of the heated fluid from the respective cooling component to the fluid chamber.

14. The computing system of claim 12, wherein the fluid chamber comprises a fluid inlet, a fluid outlet, a first fluid section, and a second fluid section, wherein the first fluid section and the second fluid section are disposed within the fluid chamber, wherein the first fluid section is connected to the fluid inlet and to the second end of each of the plurality of first inlet connectors, and wherein the second fluid section is connected to the second end of each of the plurality of first outlet connectors and to the fluid outlet.

15. The computing system of claim 12, wherein the fluid chamber comprises a fluid inlet, a fluid outlet, an inlet conduit, and an outlet conduit, wherein the inlet conduit and the outlet conduit are disposed within the fluid chamber, and wherein the inlet conduit is connected to the fluid inlet and to the second end of each of the plurality of first inlet connectors, and wherein the outlet conduit is connected to the second end of each of the first outlet connectors and to the fluid outlet.

16. The computing system of claim 12, wherein the upper surface of the fluid chamber comprises a dielectric layer.

17. The computing system of claim 10, wherein each of the plurality of cooling components is pushed vertically downwards to connect each second fluid connector of the plurality of second fluid connectors to a respective first fluid connector of the plurality of first fluid connectors, and wherein each of the plurality of cooling components is pulled vertically upwards to disconnect each second fluid connector of the plurality of second fluid connectors from the respective first fluid connector of the plurality of first fluid connectors.

18. The computing system of claim 10, wherein each first fluid connector of the plurality of first fluid connectors is one of a quick-disconnect plug or a quick-disconnect receptacle, and wherein each second fluid connector of the plurality of second fluid connectors is the other one of the quick-disconnect plug or the quick-disconnect receptacle.

19. A method comprising:
coupling a fluid chamber of a fluid cooling assembly to a support structure of a computing system, wherein the fluid chamber comprises a plurality of first fluid connectors;
mounting a circuit board of the computing system on the fluid chamber, wherein the circuit board comprises a plurality of electronic components;
thermally coupling a plurality of cooling components to the plurality of electronic components, wherein each of the plurality of cooling components comprises a plurality of second fluid connectors;
protruding a first end of each first fluid connector of the plurality of first fluid connectors or a first end of each second fluid connector of the plurality of second fluid connectors beyond a first surface of the circuit board, and a second end of each first fluid connector or a second end of each second fluid connector beyond a second surface of the circuit board; and
connecting the first end of each first fluid connector of the plurality of first fluid connectors to the first end of a respective second fluid connector of the plurality of second fluid connectors via the circuit board, to establish a parallel fluid flow path between the fluid chamber and each of the plurality of cooling components.

20. The method of claim 19, wherein protruding the first end beyond the first surface of the circuit board comprises passing through the first end of each first fluid connector of the plurality of first fluid connectors or the first end of each second fluid connector of the plurality of second fluid connectors via a respective through-hole of a plurality of through-holes formed in the circuit board.

* * * * *